(12) United States Patent
Kondo

(10) Patent No.: US 7,565,994 B2
(45) Date of Patent: Jul. 28, 2009

(54) WIRE BONDING APPARATUS

(75) Inventor: Yutaka Kondo, Tachikawa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 478 days.

(21) Appl. No.: 11/061,271

(22) Filed: Feb. 17, 2005

(65) Prior Publication Data

US 2005/0184128 A1    Aug. 25, 2005

(30) Foreign Application Priority Data

Feb. 20, 2004    (JP) .............................. 2004-045130

(51) Int. Cl.
*B23K 20/10*    (2006.01)
*B23K 1/06*    (2006.01)

(52) U.S. Cl. .................... 228/1.1; 228/4.5; 228/110.1; 228/180.5

(58) Field of Classification Search ................. 228/4.5, 228/180.5, 1.1, 110.1
See application file for complete search history.

(56) References Cited

U.S. PATENT DOCUMENTS 5,275,324 A * 1/1994 Yamazaki et al. ............ 228/1.1

FOREIGN PATENT DOCUMENTS

| JP | 57-18130 | 1/1982 |
|----|----------|--------|
| JP | 63-297048 | 12/1988 |
| JP | 04-048663 | 2/1992 |
| JP | 05-275502 | 10/1993 |
| JP | 09-018064 | 1/1997 |
| JP | 3245445 | 1/2002 |

* cited by examiner

Primary Examiner—Jerry Lorengo
Assistant Examiner—Kevin M Johnson
(74) Attorney, Agent, or Firm—William L. Androlia; H. Henry Koda

(57) ABSTRACT

In an bonding apparatus, a piezoelectric element 4 being built into the vicinity of the capillary attachment portion of a bonding arm 1 so that the capillary 3 can be caused to vibrate in the axial direction of the bonding arm 1. The preparatory pressure application device that applies a preparatory pressure to the piezoelectric element 4 includes two wedge-form attachment bases 5 and 6 which are disposed to the rear of or behind the piezoelectric element 4, and a preparatory pressure bolt 7 which is screwed into the wedge-form attachment base 6 from the outside of the bonding arm 1; and a preparatory pressure is applied to the piezoelectric element 4 by the movement of the wedge-form attachment base 5 in the axial direction of the bonding arm 1 caused by the rotation of the preparatory pressure bolt 7.

3 Claims, 3 Drawing Sheets

WIRE BONDING APPARATUS

BACKGROUND OF THE INVENTION

1. Technical Field

The present invention relates to a wire bonding apparatus that performs bonding while causing the capillary to vibrate by means of a piezoelectric element.

2. Description of the Related Art

Japanese Patent No. 3245445 (Japanese Patent Application Laid-Open (Kokai) No. H5-275502) discloses an example of a wire bonding apparatus that causes a capillary to vibrate by means of a piezoelectric element. In this prior art, a piezoelectric element is incorporated in the vicinity of the capillary attachment portion of the bonding arm so that the capillary vibrates in the axial direction of the bonding arm. In the bonding arm, a preparatory pressure bolt that applies a preparatory pressure to the piezoelectric element is installed on the axial line of the bonding arm in the rear portion of or behind the piezoelectric element.

In the above-described prior art, the preparatory pressure bolt that applies a preparatory pressure is provided on the axial line of the bonding arm on the rear portion of or behind the piezoelectric element; accordingly, adjustment of the preparatory pressure and replacement of the piezoelectric element cannot be performed unless the bonding arm is removed from the bonding apparatus, which is inconvenient and leads to the problem of inferior maintenance characteristics.

BRIEF SUMMARY OF THE INVENTION

Accordingly, the object of the present invention is to provide a wire bonding apparatus in which a preparatory pressure adjustment of the piezoelectric element and a replacement of the piezoelectric element are performed without removing the bonding arm from the wire bonding apparatus, thus improving the maintenance characteristics of the bonding arm.

The above object is accomplished by a unique structure of the present invention for a wire bonding apparatus that includes: a bonding arm having a capillary, a piezoelectric element provided near the capillary so as to cause the capillary to vibrate in the axial direction of the bonding arm, and a preparatory pressure application means provided in the bonding arm so as to apply a preparatory pressure to the piezoelectric element; and in the present invention, the preparatory pressure application means is comprised of:

an external operating portion that is operable from the outside of the bonding arm, and a conversion portion that converts the movement of the external operating portion into the movement in the axial direction of the bonding arm and applies a preparatory pressure to the piezoelectric element.

In the above structure of the present invention, the preparatory pressure application means is comprised of a front wedge-form attachment base and a rear wedge-form attachment base that are provided behind the piezoelectric element and a preparatory pressure bolt that is screwed in the rear wedge-form attachment base from the outside of the bonding arm; and a preparatory pressure is applied to the piezoelectric element by the movement of the front wedge-form attachment base in the axial direction of the bonding arm that is caused by the movement of the rear wedge-form attachment base in the direction of the preparatory pressure bolt caused by the rotation of the preparatory pressure bolt.

Furthermore, in the wire bonding apparatus of the present invention, the preparatory pressure application means can be comprised of an attachment base disposed behind the piezoelectric element, and an eccentric pin that causes the attachment base to move in the axial direction of the bonding arm;

the eccentric pin is comprised of a shaft portion, which is shaft-supported on the bonding arm so that the shaft portion is free to rotate, and an operating portion, which is eccentric from the shaft portion and protrudes to the outside of the bonding arm so as to be operable from outside; and a preparatory pressure is applied to the piezoelectric element by operating the operating portion to move the attachment base in the axial direction of the bonding arm.

In the present invention, the preparatory pressure application means is comprised of an external operating portion that is operable from the outside of the bonding arm and a conversion portion that converts the movement of this external operating portion into a movement in the axial direction of the bonding arm and applies a preparatory pressure to the piezoelectric element. Accordingly, a preparatory pressure can be applied to the piezoelectric element by operating the external operating portion disposed outside of the bonding arm. More specifically, the preparatory pressure can be adjusted without removing the bonding arm from the bonding apparatus. Furthermore, in cases where the piezoelectric element is to be replaced, such replacing can be accomplished without removing the bonding arm from the bonding apparatus. Thus, in the present invention, the maintenance characteristics of the bonding arm are high.

DETAILED DESCRIPTION OF THE INVENTION

Figure 1:
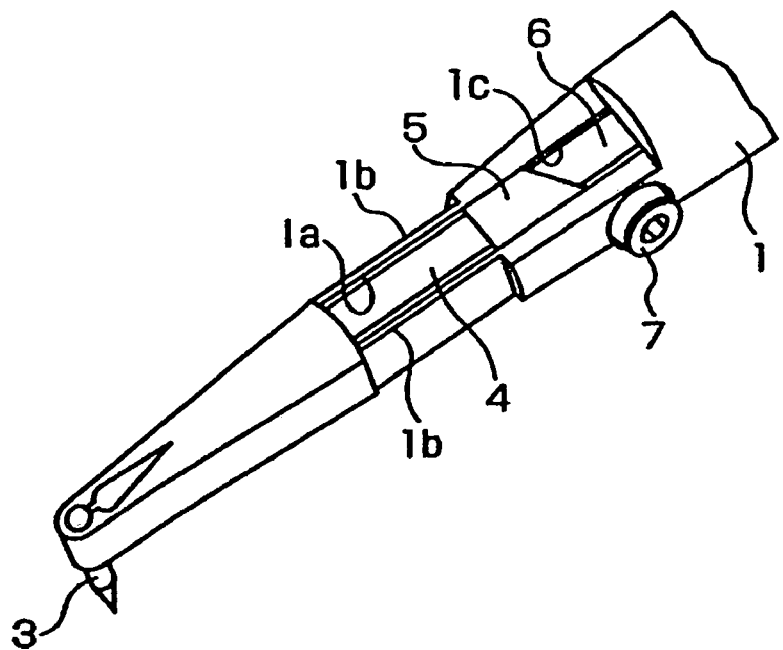
FIG. 1 is a perspective view of the essential portion of the first embodiment of bonding arm of the wire bonding apparatus according to the present invention.
Figure 2A:
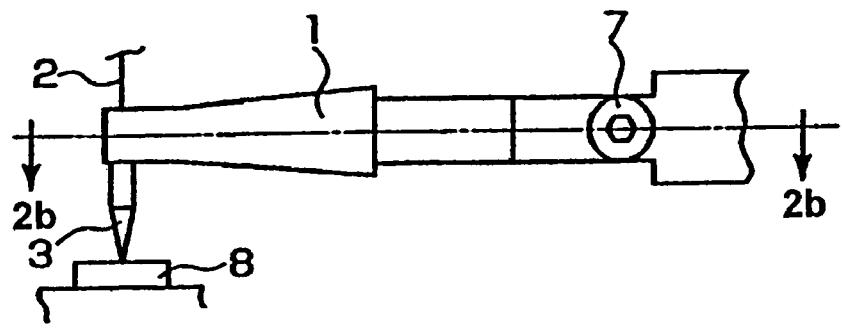
FIG. 2A is a side view of the bonding arm of FIG. 1.
Figure 2B:
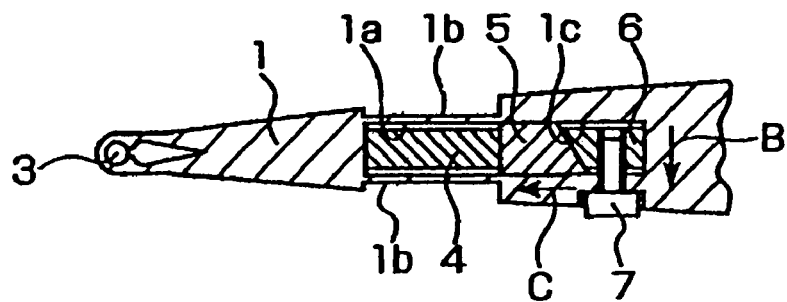
FIG. 2B is a sectional view taken along the line 2b-2b in FIG. 2A.

The first embodiment of the wire bonding apparatus of the present invention will be described with reference to FIGS. 1, 2A and 2B.

A capillary 3 through which a wire 2 is passed is fastened to the tip end of the bonding arm 1.

A piezoelectric element opening 1a is formed in the bonding arm 1 so that the piezoelectric element opening 1a is in the vicinity of the attachment portion of the capillary 3. Both side portions of the piezoelectric element opening 1a are elastic portions 1b made of thin elements. In addition, an attachment base opening 1c is formed on the rear part of or behind the piezoelectric element opening 1a (i.e., on the right side in FIG. 2B).

A piezoelectric element 4 is provided inside the piezoelectric element opening 1a, and two wedge-form attachment bases, a front wedge-form attachment base 5 and a rear wedge-form attachment base 6 are provided inside the attachment base opening 1c.

So as to hold the piezoelectric element 4 and front and rear wedge-form attachment bases 5 and 6 in the piezoelectric element opening 1a and attachment base opening 1c, respectively and so as to apply a preparatory pressure to the piezoelectric element 4, an internal screw is formed in the rear wedge-form attachment base 6, and a preparatory pressure bolt 7 which is inserted from the side of the bonding arm 1 is screwed into this internal screw of the rear wedge-form attachment base 6.

The strain direction of the piezoelectric element 4 is set to be perpendicular to the central axis of the capillary 3, and in addition, the piezoelectric element 4 is provided so as to expand and contract in the axial direction of the bonding arm 1. In FIG. 2A, the reference number 8 is a sample or an object of bonding.

In the above structure, when the preparatory pressure bolt 7 is screwed in, the rear wedge-form attachment base 6 is moved in the direction of the preparatory pressure bolt 7 (the direction of arrow B). Since the contact surfaces of the wedge-form attachment bases 5 and 6 have a wedge shape, the front wedge-form attachment base 5 is moved in the direction of or toward the capillary 3 (the direction of arrow C in FIG. 2B) by the movement of the rear wedge-form attachment base 6. As a result, a preparatory pressure is applied to the piezoelectric element 4.

Thus, since the preparatory pressure bolt 7 is provided on the bonding arm 1, a preparatory pressure adjustment can be performed by merely turning the preparatory pressure bolt 7 without removing the bonding arm 1 from the bonding apparatus. Furthermore, when the piezoelectric element 4 is to be replaced, the replacement can be done by merely loosening the preparatory pressure bolt 7 from the bonding arm 1 without removing the bonding arm 1 from the bonding apparatus.

Next, the operation of the bonding arm will be described below.

The bonding operation is accomplished by a known method so that the bonding arm 1 is moved in the horizontal plane and raised and lowered, thus moving the capillary 3 in the horizontal plane and raised and lowered. Accordingly, a detailed description of this operation will be omitted.

When a voltage is applied to the piezoelectric element 4, the vibration caused by the expansion and contraction of the piezoelectric element 4 is transmitted to the capillary 3 via the bonding arm 1. The wire 2 is joined, i.e., bonded, to the sample 8 by this vibration energy that is transmitted to the capillary 3.

Figure 3:
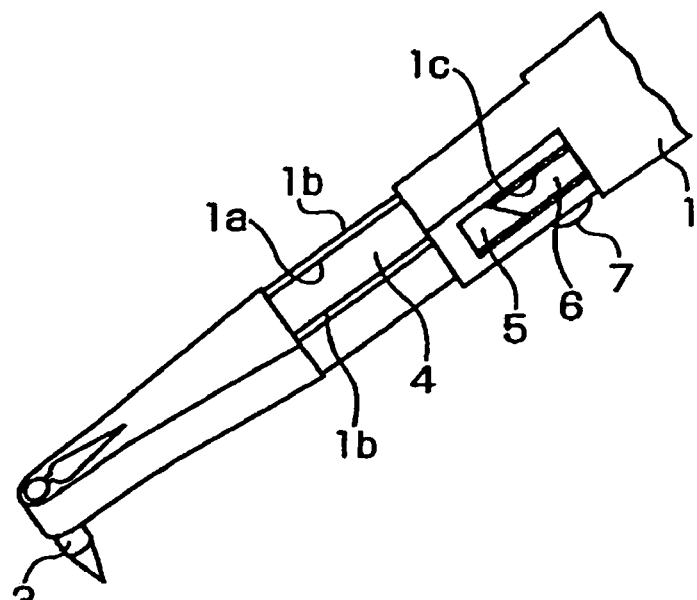
FIG. 3 is a perspective view of the essential portion of the second embodiment of the bonding arm of the wire bonding apparatus according to the present invention.
Figure 4A:
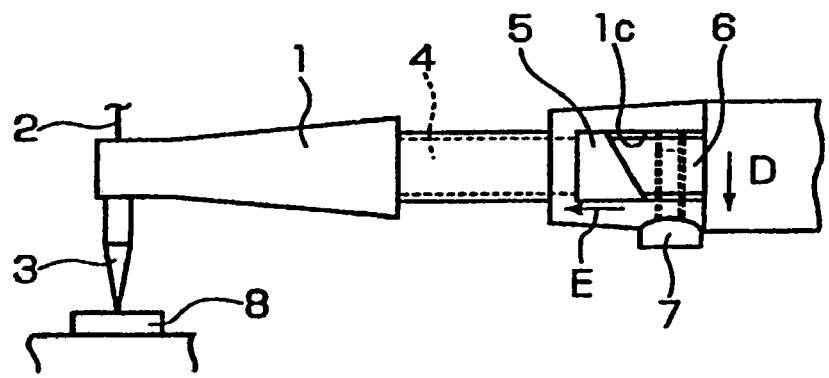
FIG. 4A is a side view of the bonding arm of FIG. 3.
Figure 4B:
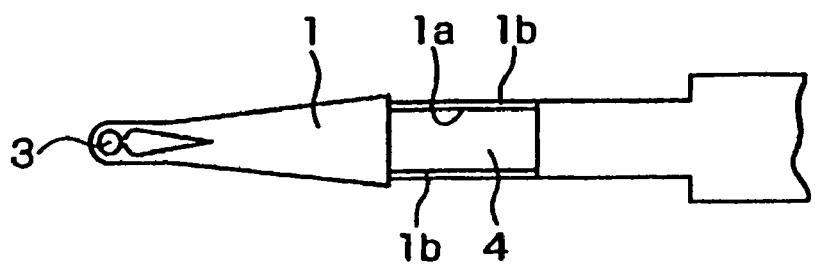
FIG. 4B is a top view thereof.

Next, the second embodiment of the wire bonding apparatus of the present invention will be described with reference to FIG. 3 through FIG. 4B. The reference members that are the same as those in the first embodiment or those corresponding to the elements in the first embodiment are labeled with the same reference numbers, and a detailed description of such elements is omitted.

In the above-described first embodiment, the piezoelectric element opening 1a and attachment base opening 1c are formed so that these openings pass through the bonding arm from the upper surface to the undersurface. In the second embodiment, however, the piezoelectric element opening 1a is formed so that this opening passes through the bonding arm 1 from the upper surface to the undersurface in the same manner as in the above-described embodiment; but the attachment base opening 1c is formed so as to pass through the bonding arm from one side surface to the other side surface. Furthermore, the internal screw is formed perpendicularly in the rear wedge-form attachment base 6, and the preparatory pressure bolt 7 that is inserted from beneath the bonding arm 1 is screwed into this internal screw of the rear wedge-form attachment base 6.

Accordingly, in the structure of the second embodiment, when the preparatory pressure bolt 7 is screwed in, the rear wedge-form attachment base 6 is moved in the direction of or toward the preparatory pressure bolt 7 (the direction of arrow D). Since the contact surfaces of the front and rear wedge-form attachment bases 5 and 6 have a wedge shape, the front wedge-form attachment base 5 is moved in the direction of or toward the capillary 3 (the direction of arrow E). As a result, a preparatory pressure is applied to the piezoelectric element 4.

Thus, since the preparatory pressure bolt 7 is disposed on the undersurface of the bonding arm 1, the preparatory pressure can be adjusted by merely turning the preparatory pressure bolt 7 without removing the bonding arm 1 from the apparatus. Furthermore, in cases where the piezoelectric element 4 is to be replaced, such a replacement can be done by merely removing the preparatory pressure bolt 7 from the bonding arm 1 without removing the bonding arm 1 from the bonding apparatus. Moreover, it goes without saying that the preparatory pressure bolt 7 can be provided on the upper surface of the bonding arm 1.

Figure 5A:
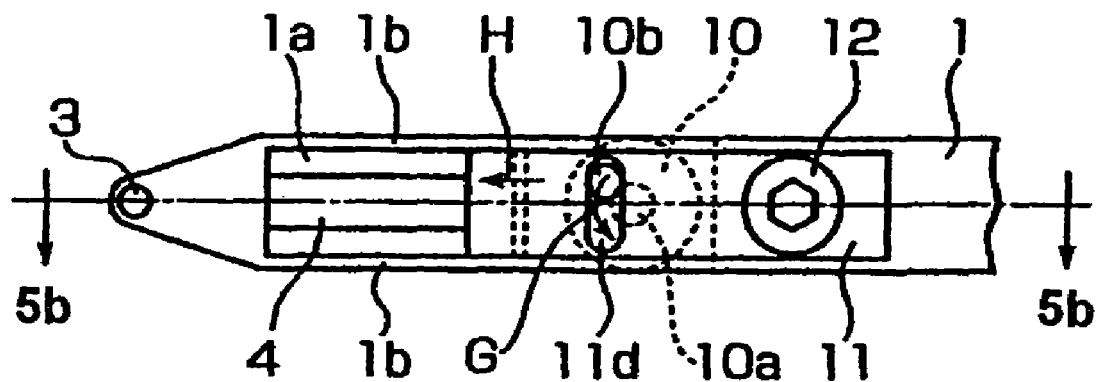
FIG. 5A is a bottom view of the essential portion of the third embodiment of the bonding arm of the wire bonding apparatus of the present invention.
Figure 5B:
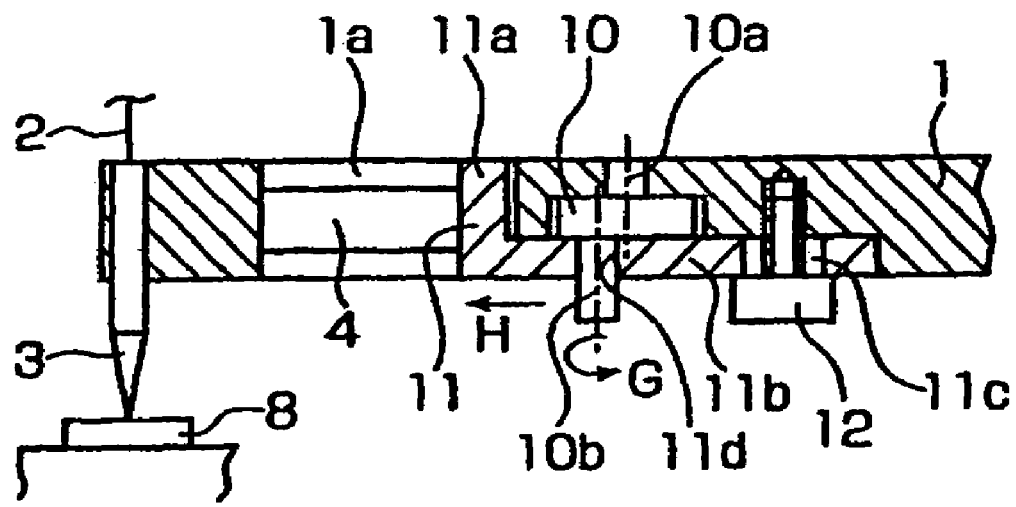
FIG. 5B is a sectional view taken along the line 5b-5b in FIG. 5A.

The third embodiment of the present invention will be described with reference to FIGS. 5A and 5B.

In this third embodiment, an eccentric pin 10 is used instead of the wedge-form attachment bases 5 and 6 and preparatory pressure bolt 7 of the respective embodiments described above. More specifically, a piezoelectric element 4 and the rising portion 111a of an L-shaped attachment base 11 are provided inside the piezoelectric element opening 1a, and the horizontal surface portion 11b of the attachment base 11 is disposed on the undersurface of the bonding arm 1.

The attachment base 11 is fastened to the bonding arm 1 by a fastening screw 12, and a hole 11c that is larger than the screw portion of the fastening screw 12 is formed in the fastening screw portion of the attachment base 11 so that the attachment base 11 is movable in the axial direction of the bonding arm 1.

The shaft portion 10a of the eccentric pin 10 is supported on the bonding arm 1 in a rotatable fashion, and an operating portion 10b that is eccentric from the shaft portion 10a is passed through the horizontal surface portion 11b of the attachment base 11. The operating portion hole 11d of the attachment base 11 through which the operating portion 10b is passed is formed as a slot that extends in the direction perpendicular to the axial direction of the bonding arm 1.

Accordingly, in the above structure of the present invention, when the operating portion 10b is turned in the direction of arrow G with the fastening screw 12 slightly loosened, then the eccentric pin 10 is rotated about its shaft portion 10a, and the operating portion 10b is moved toward the capillary 3 (in the direction of arrow H) along the operating portion hole 11d formed in the attachment base 11. As a result, the attachment base 11 is moved in the direction of arrow H, and a preparatory pressure is applied to the piezoelectric element 4. Following the adjustment of the preparatory pressure, the fastening screw 12 is tightened and the eccentric pin 10 is fastened to the bonding arm 1.

In the above structure as well, since the operating portion 10b of the eccentric pin 10 is disposed outside of the bonding arm 1, the preparatory pressure can be adjusted by merely turning the operating portion 10b without removing the bonding arm 1 from the bonding apparatus. Furthermore, when the piezoelectric element 4 is to be replaced, this can be accomplished by merely removing the fastening screw 12 from the bonding arm 1 without removing the bonding arm 1 from the bonding apparatus.

The invention claimed is:

1. A wire bonding apparatus comprising:
a bonding arm having a capillary,
a piezoelectric element provided in the vicinity of said capillary so as to cause said capillary to vibrate in an axial direction of said bonding arm, and
a preparatory pressure application means provided in said bonding arm so as to apply a preparatory pressure to said piezoelectric element; wherein
said preparatory pressure application means is comprised of:
   a front wedge-form attachment base and a rear wedge-form attachment base that are provided behind said piezoelectric element, and
   a preparatory pressure bolt that is screwed in said rear wedge-form attachment base from an outside of said bonding arm; and wherein
a preparatory pressure is applied to said piezoelectric element by a movement of said front wedge-form attachment base in said axial direction of said bonding arm that is caused by a movement of said rear wedge-form attachment base in a direction of said preparatory pressure bolt as a result of a rotation of said preparatory pressure bolt.

2. A wire bonding apparatus comprising:
a bonding arm having a capillary,
a piezoelectric element provided in the vicinity of said capillary so as to cause said capillary to vibrate in an axial direction of said bonding arm, and
a preparatory pressure application means provided in said bonding arm so as to apply a preparatory pressure to said piezoelectric element; wherein
said preparatory pressure application means is comprised of:
   an attachment base provided behind said piezoelectric element, and
   an eccentric pin that causes said attachment base to move in said axial direction of said bonding arm; and
said eccentric pin is comprised of:
   a shaft portion that is shaft-supported on said bonding arm so that said shaft portion is free to rotate, and
   an operating portion which is eccentric from said shaft portion and protrudes to outside of said bonding arm so as to be operable from outside; and wherein
a preparatory pressure is applied to said piezoelectric element by operating said operating portion to move said attachment base in said axial direction of said bonding arm.

3. A wire bonding apparatus comprising:
a bonding arm having a capillary;
a piezoelectric element provided in the vicinity of said capillary so as to cause the capillary to vibrate in an axial direction of said bonding arm;
a preparatory pressure application means provided in said bonding arm so as to apply a preparatory pressure to said piezoelectric element;
wherein said preparatory pressure application means is one of a preparatory pressure bolt type mechanism and an eccentric pin type mechanism;
said preparatory pressure bolt type mechanism including;
   a front wedge-form attachment base and a rear wedge-form attachment base that are provided behind said piezoelectric element, and
   a preparatory pressure bolt that is screwed in said rear wedge-form attachment base from an outside of said bonding arm and said preparatory pressure is applied to said piezoelectric element by movement of said front wedge-form attachment base in said axial direction of said bonding arm that is caused by a movement of said rear wedge-form attachment base in a direction of said preparatory pressure bolt as a result of a rotation of said preparatory pressure bolt; and
said eccentric pin type mechanism including;
   an attachment base provided behind said piezoelectric elements, and
   an eccentric pin that causes said attachment base to move in said axial direction of said bonding arm and said eccentric pin having a shaft portion that is shaft-supported on said bonding arm so that said shaft portion is free to rotate, and an operating portion which is eccentric from. said shaft portion and protrudes to outside of said bonding arm so as to be operable from outside and said preparatory pressure is applied to said piezoelectric element by operating said operating portion to move said attachment base in said axial direction of said bonding arm.

* * * * *